United States Patent [19]

Chown

[11] 4,182,935
[45] Jan. 8, 1980

[54] OPTICAL FIBER DATA TRANSMISSION SYSTEM

[75] Inventor: Martin Chown, Harlow, England

[73] Assignee: International Standard Electric Corporation, New York, N.Y.

[21] Appl. No.: 851,033

[22] Filed: Nov. 14, 1977

[30] Foreign Application Priority Data

Dec. 7, 1976 [GB] United Kingdom ............... 50962/76

[51] Int. Cl.² ........................... H04J 3/04; H04J 1/00; H04J 4/00
[52] U.S. Cl. .............................. 179/15 AL; 250/199; 350/96.15
[58] Field of Search ......... 179/15 AL, 15 BM, 2.5 R; 250/199; 340/189 R; 350/96.15

[56] References Cited

U.S. PATENT DOCUMENTS

| | | | |
|---|---|---|---|
| 2,406,165 | 8/1946 | Schroeder | 179/15 AL |
| 2,520,185 | 8/1950 | van Mierco | 179/15 AL |
| 3,342,941 | 9/1967 | Konod | 179/15 FD |
| 3,603,932 | 9/1971 | Kerr | 179/15 BS |
| 3,676,684 | 7/1972 | De Lange | 179/15 FD |
| 3,804,988 | 4/1974 | Browne | 179/2.5 R |
| 3,838,278 | 9/1974 | Duguay | 250/199 |
| 3,849,604 | 11/1974 | Benes | 250/199 |

Primary Examiner—David L. Stewart
Attorney, Agent, or Firm—John T. O'Halloran; Alfred C. Hill

[57] ABSTRACT

Optical sensors may be arranged to give transmission or reflection of signals along optical fibers depending on the quantity to be measured. The outputs of several sensors may be simply multiplexed onto a single fiber (or pair) by putting a different delay line in series with each sensor. Similarly optical filters can be used separately or combined with the delay lines and/or space division multiplexing can be used to increase the number of sensors. Local frequency modulation of the sensors offer an additional means of multiplexing.

17 Claims, 11 Drawing Figures

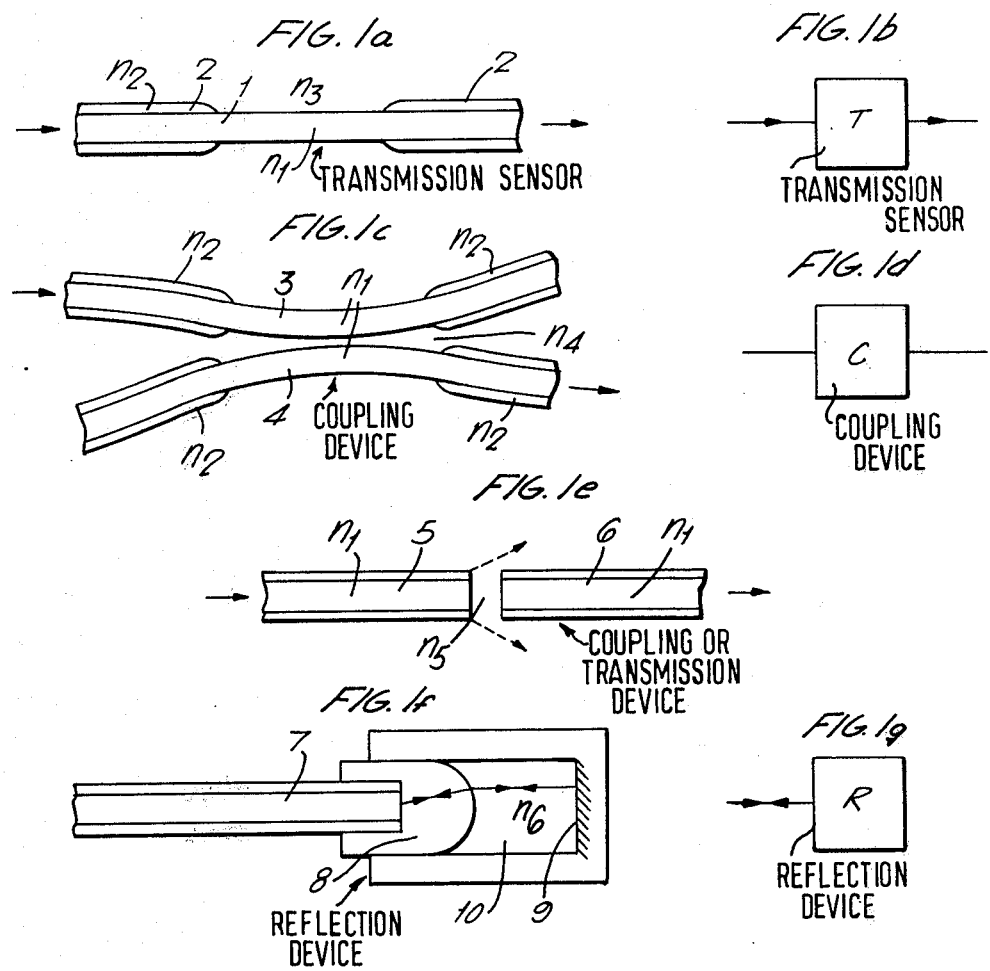
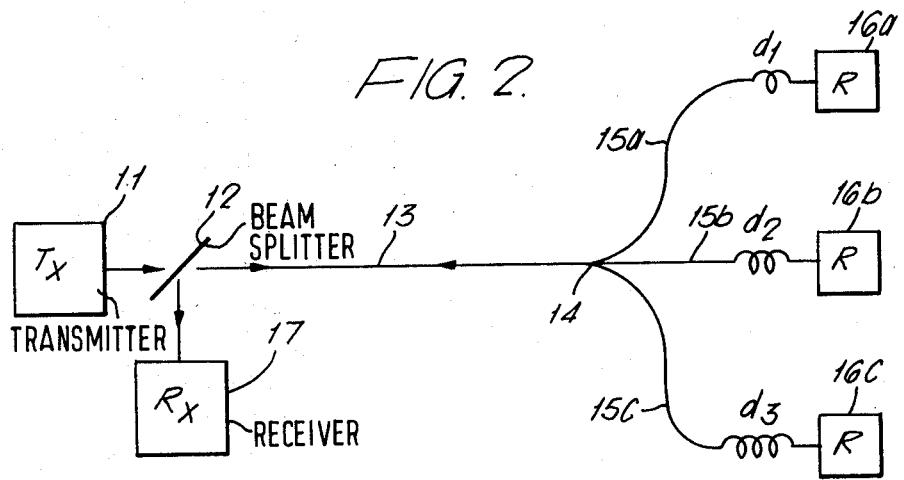

OPTICAL FIBER DATA TRANSMISSION SYSTEM

BACKGROUND OF THE INVENTION

This invention relates to optical fiber data transmission systems in which data from a plurality of optical signal devices is required to be multiplexed onto a single optical fiber.

SUMMARY OF THE INVENTION

According to the present invention there is provided an optical fiber data transmission system including a plurality of optical signal devices, means for transmitting an optical interrogatory signal to all of the devices, an optical receiver, a single optical fiber optically coupled at one end to all of the devices and at the other end to the receiver, and means associated with each of the devices to discriminate between the optical output signals emitted from the devices in response to the interrogatory signal.

The invention is applicable to all types of optical sensor in which the presence (or absence) of a surrounding material is detected by a change in the refractive index of the fiber surroundings. Such sensor devices may utilize a change in reflection from a fiber end, a change in transmission efficiency along a short length of fiber or a change in the coupling coefficient between two short adjacent lengths of fiber. It also applies to pushbutton signalling.

BRIEF DESCRIPTION OF THE DRAWING

Above-mentioned and other features and objects of this invention will become more apparent by reference to the following description taken in conjunction with the accompanying drawing, in which:

FIGS. 1a–1g illustrates sensor device symbols used in the other FIGURES;

FIG. 2 is a block diagram illustrating the use of optical delay lines to discriminate between a plurality of reflecting sensor devices whose outputs are multiplexed onto a single optical fiber;

DESCRIPTION OF THE PREFERRED EMBODIMENTS

Figure 3:
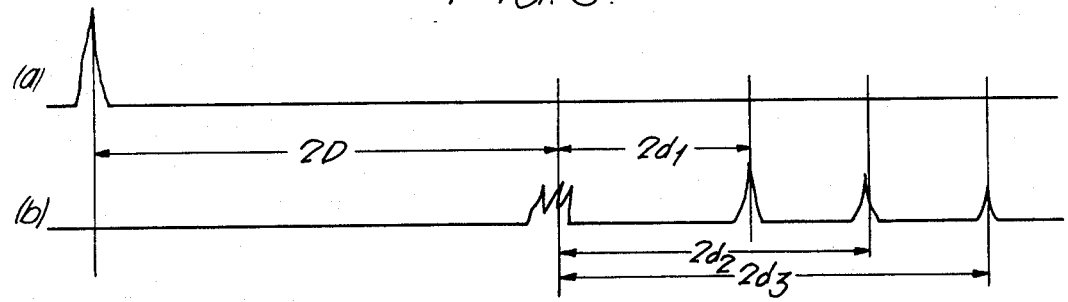
FIG. 3 illustrates waveforms relating to the system of FIG. 2.

Referring to FIGS. 1a–1f, the invention may be used with a variety of optical sensor devices which are basically of three different types. FIG. 1a illustrates what may be termed a "transmission" sensor. An optical fiber 1 of refractive index $n_1$ is normally clad with material 2 having a higher refractive index $n_2$. A short portion of this cladding is removed so that in air the light propagating down the fiber is not confined within the fiber where the cladding has been removed. Thus the light propagating down the remainder of the fiber is considerably attenuated. If now the unclad portion of the fiber is immersed in a liquid having a refractive index $n_3$ greater than $n_1$ the effect will be analogous to replacing the cladding and normal optical propagation will be restored in the unclad section. Throughout the drawings a transmission type sensor will be depicted by the symbol shown at FIG. 1b. FIG. 1c illustrates another type of sensor device, which may be termed a coupling device, comprising two adjacent lengths 3 and 4 of unclad fiber. Here the coupling coefficient between the fibers depends on the refractive index $n_4$ of the medium surrounding the unclad lengths. If $n_4$ is approximately equal to $n_1$ coupling will occur between lengths 3 and 4. The symbol shown in FIG. 1d is used for a coupling device. FIG. 1e depicts a device in which two lengths 5 and 6 of fiber are separated by a small gap. Light propagating down one fiber will be coupled into the end of the other fiber, the coupling coefficient depending on the refractive index $n_5$ of the medium filling the gap. This device may be considered as either a coupling device or a transmission device. FIG. 1f depicts what may be termed a reflection device. Light issuing from the end of the fiber 7 is focussed by means of a lens 8 onto a mirror 9 and is then reflected back into the fiber 7. The reflection coefficient is dependent on the refractive index $n_6$ of the material, e.g. liquid, filling the space 10 between lens 8 and mirror 9. The symbol for a reflection device is shown at FIG. 1g. Although the reflection device is depicted as having an integral mirror a variation of this is an arrangement in which the lens scans a surface or surfaces which carry mirrors in a moving relationship with the lens.

Typical applications for an array of sensor devices of one or other of the types described above are for liquid level measurement, where the level of the liquid progressively covers or uncovers devices, or in digital shaft encoding where each of a number of devices scans one band of a rotating disc, the bands being provided with digitally encoded areas of reflection or transmission.

FIG. 2 illustrates a data transmission system in which the outputs from a number of sensor devices, in this case reflection devices, are multiplexed onto a single optical fiber. A transmitter 11 sends a pulse of light via a beam splitter 12 down an optical fiber 13 which is coupled at point 14 to individual fibers 15a, 15b, 15c leading to associated reflection type sensor devices 16a, 16b and 16c. Each of the individual fibers 15a, 15b and 15c incorporates a different amount of optical delay $d_1$, $d_2$ and $d_3$, which is simply achieved by winding different lengths of fiber in a coil. The pulse reflections from devices 16a, 16b and 16c are propagated back via delays $d_1$, $d_2$ and $d_3$ in the individual fibers, the coupling point 14, the single fiber 13 and beam splitter 12 to a receiver 17. The operation of the system is illustrated in FIG. 3. The light pulse from transmitter 11 is shown at FIG. 3, curve (a).

The length of the optical fiber 13 is considered in terms of optical delay and is given as D and after a period 2D, spurious reflections may be expected from the coupling at point 14. After a further period $2d_1$ any reflection from device 16a will be received, while after period $2D+2d_2$ a reflection from 16b will be received and so on. The receiver 17 includes logic circuitry arranged to time demultiplex the received signals. Such circuitry forms no part of the present invention and is readily designed by those skilled in the art.

Figure 4:
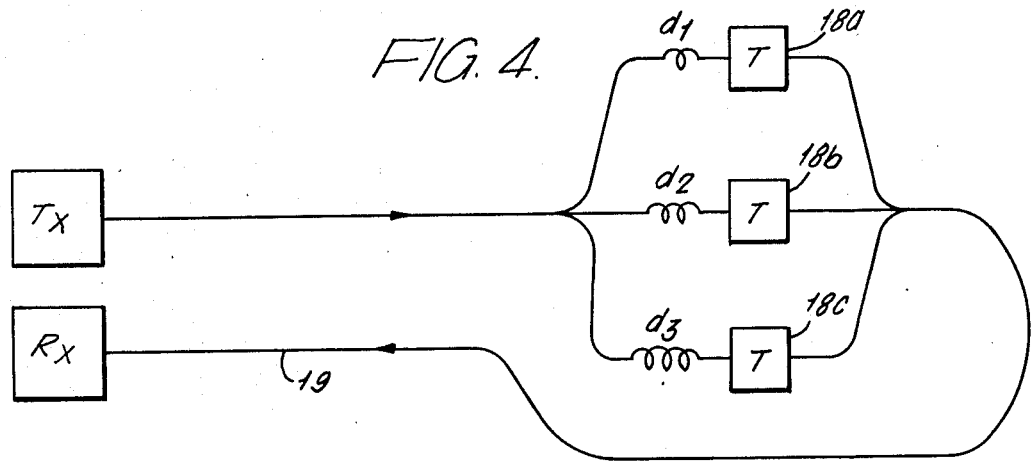
FIG. 4 is a block diagram illustrating the use of optical delay lines with transmission type sensor devices and a pair of optical fibers.

The arrangement shown in FIG. 4 is similar to that shown in FIG. 2 but the sensor devices are now transmission devices 18a, 18b and 18c and the devices are coupled to the receiver by separate single fiber 19. No beam splitter is required.

The system shown in FIG. 5 is again similar to that of FIG. 2 but instead of time division multiplexing wavelength (frequency) multiplexing is used. The individual fibers now incorporate different color filters $\lambda_1$, $\lambda_2$ and $\lambda_3$ instead of delays. Although all the reflections will now be received simultaneously by the receiver 19 they are demultiplexed by filters $\lambda_{11}$, $\lambda_{21}$ and $\lambda_{31}$ in separate inputs to the receiver. As an alternative to using filters at the receiver the transmitter 20 can be arranged to provide a sequence of pulses at wavelengths $\lambda_1$, $\lambda_2$ and $\lambda_3$. The receiver is then synchronized with the transmitter, as indicated by the dotted line, for sequential processing of the received signals.

Figure 5:
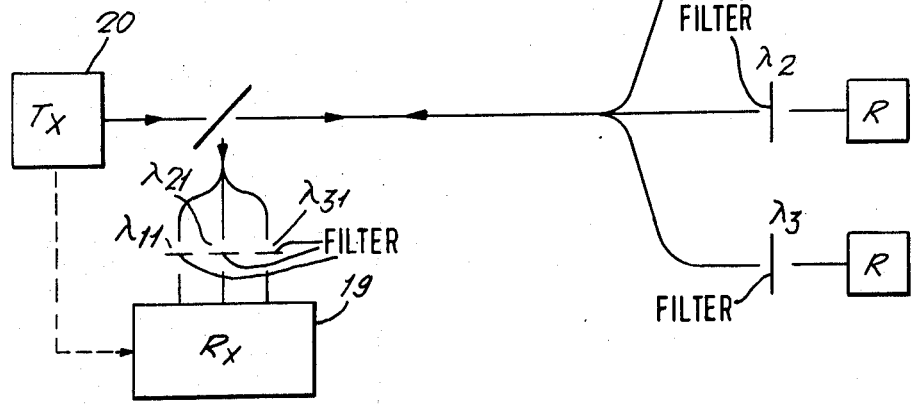
FIG. 5 is a block diagram illustrating the use of optical filters to discriminate between sensor devices.
Figure 6:
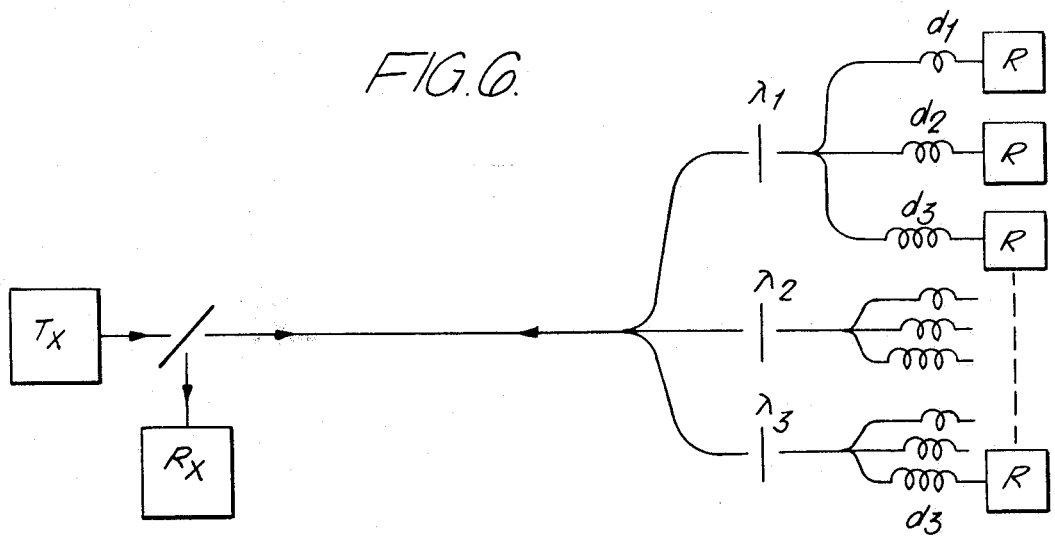
FIG. 6 is a block diagram illustrating the use of a combination of optical filters and optical delay lines to discriminate between sensor devices.
Figure 7:
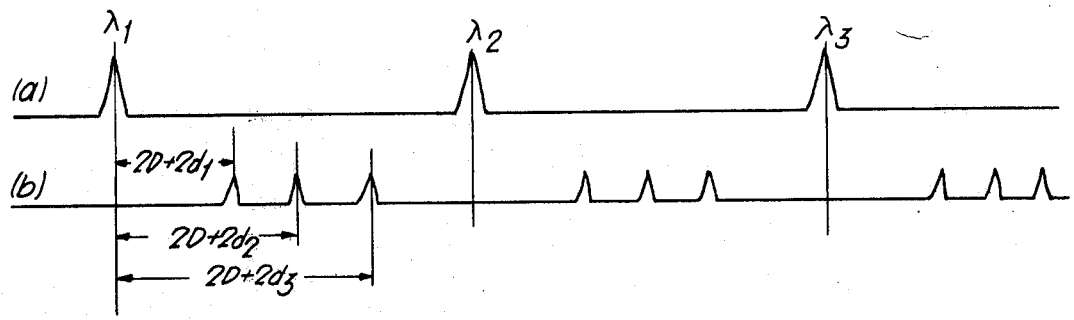
FIG. 7 illustrates waveforms relating to the system of FIG. 6.

The system shown in FIG. 6 uses a combination of the techniques of FIGS. 2 and 5. A large number of sensor devices are divided into groups and the groups are multiplexed on a color basis. The individual devices in each group are sub-multiplexed using delays. Thus using only three filters and three sets of delays, each set being the same as the others, a total of nine devices can be multiplexed onto a single fiber. FIG. 7 shows how the system works using a synchronized receiver with a transmitter emitting a sequence of differently colored pulses.

Figure 8:
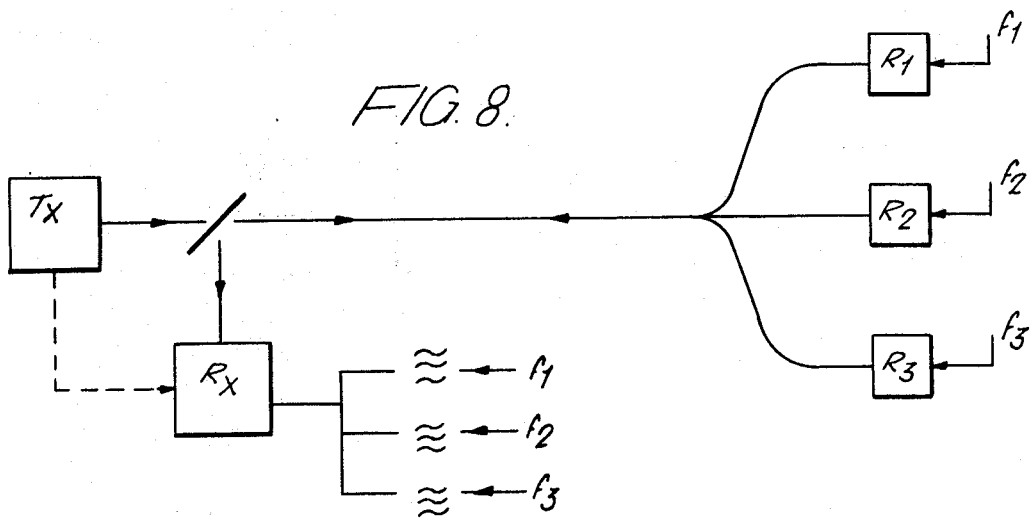
FIG. 8 is a block diagram illustrating the use of frequency modulation of sensor devices to provide discrimination.

FIG. 8 shows a system in which the responses of the sensor devices $R_1$, $R_2$ and $R_3$ are frequency modulated, with a different frequency $f_1$, $f_2$ and $f_3$ for each device. The receiver is provided with filters for demultiplexing the responses. The sensor devices, in this case reflection devices, are designed so that their responses are controlled not only by the quantity to be measured but also by the modulating local source. Modulation can be by sine waves or pulse patterns. This method can be combined with any of the other arrangements described herein.

Figure 9:
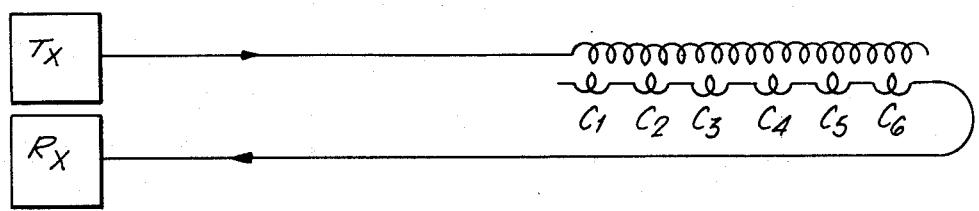
FIG. 9 is a block diagram illustrating the use of coupling between two different optical delay lines.

FIG. 9 depicts a system in which two adjacent coiled delay lines are used to provide a series of coupling sensor devices $C_1$-$C_6$. The two coils are of different pitches thus providing incremental delays between successive coupling devices. A pulse from the transmitter will produce successive responses from those coupling devices in which the coupling coefficient is increased by virtue of their being in an appropriate medium.

Figure 10:
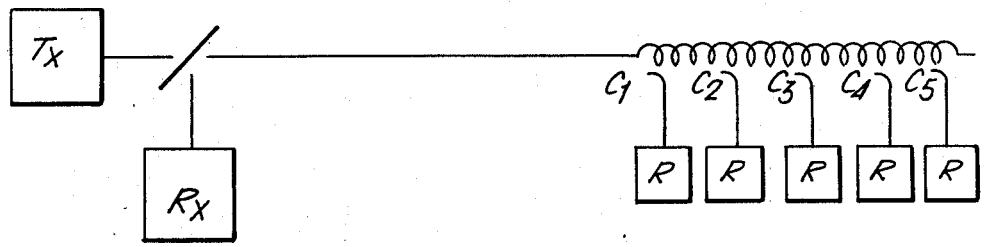
FIG. 10 is a block diagram illustrating the use of coupling between a single optical delay line and a plurality of reflecting optical sensors.

FIG. 10 shows a variation of the arrangement of FIG. 9 in which coupling devices are not provided by a second coil of fiber but individual short lengths of fiber terminated in reflecting devices. Whereas in the case of FIG. 9 the responses are carried to the receiver on a second fiber in the case of FIG. 10 they are multiplexed back onto the single fiber used for both transmission and reception.

Figure 11:
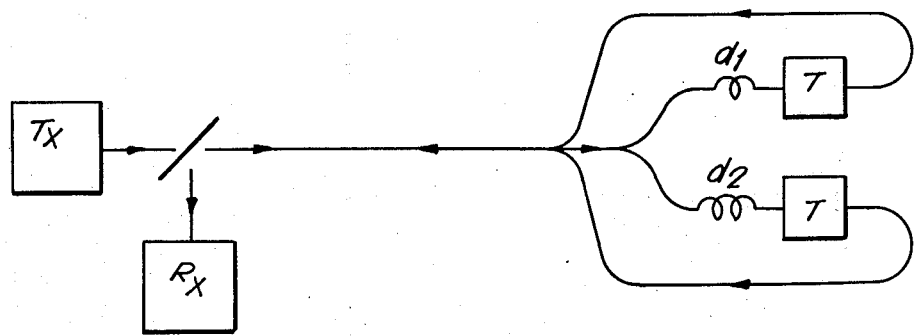
FIG. 11 is a block diagram illustrating the use of optical delay lines to discriminate between transmission type sensor devices coupled to a single optical fiber.

FIG. 11 shows yet another arrangement in which the responses from transmission sensors are coupled back onto a single fiber, in contrast to the arrangememt of FIG. 4 in which two fibers are used. Once again, discrimination is provided by the use of different delays for different devices T.

It will be understood that only some of the possible combinations of type of sensor device and type of discriminator have been described herein. In general any type of device can be incorporated in any type of discrimination system. For example, although FIG. 8 shows only reflection type sensor devices in conjunction with frequency modulation of the sensor responses it is apparent that frequency modulation can be used with the other types of devices discussed.

Although the embodiments illustrated refer only to sensor devices, the invention is also applicable to other forms of optical signalling, e.g. by pushbutton signalling devices.

While I have described above the principles of my invention in connection with specific apparatus it is to be clearly understood that this description is made only by way of example and not as a limitation to the scope of my invention as set forth in the objects thereof and in the accompanying claims.

I claim:

1. An optical fiber data transmission system comprising:
   a plurality of optical sensor devices capable of modulating an interrogatory signal;
   first means coupled to said devices for transmitting an optical interrogatory signal to all of said devices;
   an optical receiver;
   a first optical fiber optically coupled at one end to all of said devices and at the other end to said receiver; and
   a plurality of second means each coupled to a different one of said devices to discriminate between optical output signals, including said interrogatory signal modulated by sensor information, emitted from said devices in response to said interrogatory signal.

2. A system according to claim 1, wherein
   said first means transmits said interrogatory signal as pulses; and
   said second means include
      optical delay means having a different delay for each of said devices.

3. A system according to claim 1, wherein
   said first means transmits light at more than one wavelength as said interrogatory signal, and
   said second means includes
      first optical filters having a different wavelength for each of said devices.

4. A system according to claim 3, wherein
   said first means transmits said more than one wavelength continuously, and
   said receiver has coupled thereto second optical filters corresponding to said first optical filters.

5. A system according to claim 1, wherein
   said first means transmits said interrogatory signal continuously to all of said devices,
   said second means includes
      third means for frequency modulating the response of each of said devices at a different frequency, and
   said receiver includes
      fourth means for demodulating said frequency modulated response signals received from said devices.

6. A system according to claim 1, wherein
said first means and said receiver are both coupled to one end of said optical fiber,
said devices being coupled to the other end of said first optical fiber to reflect said interrogatory signal, said interrogatory signal and said reflected interrogatory signal being optically decoupled at said one end of said optical fiber.

7. A system according to claim 6, wherein
said first means transmits said interrogatory signal as pulses; and
said second means include
optical delay means having a different delay for each of said devices.

8. A system according to claim 6, wherein
said first means transmits light at more than one wavelength as said interrogatory signal, and
said second means includes
first optical filters having a different wavelength for each of said devices.

9. A system according to claim 8, wherein
said first means transmits said more than one wavelength continuously, and
said receiver has coupled thereto second optical filters corresponding to said first optical filters.

10. A system according to claim 6, wherein
said first means transmits said interrogatory signal continuously to all of said devices,
said second means includes
third means for frequency modulating the response of each of said devices at a different frequency, and
said receiver includes
fourth means for demodulating said frequency modulated response signals received from said devices.

11. A system according to claim 1, wherein
said first means is coupled to said devices by a second optical fiber, and
said devices are coupled to said first optical fiber to transmit said interrogatory signal to said receiver.

12. A system according to claim 11, wherein
said first means transmits said interrogatory signal as pulses; and
said second means include
optical delay means having a different delay for each of said devices.

13. A system according to claim 11, wherein
said first means transmits light at more than one wavelength as said interrogatory signal, and
said second means includes
first optical filters having a different wavelength for each of said devices.

14. A system according to claim 13, wherein
said first means transmits said more than one wavelength continuously, and
said receiver has coupled thereto second optical filters corresponding to said first optical filters.

15. A system according to claim 11, wherein
said first means transmits said interrogatory signal continuously to all of said devices,
said second means includes
third means for frequency modulating the response of each of said devices at a different frequency, and
said receiver includes
fourth means for demodulating said frequency modulated response signals received from said devices.

16. A system according to claim 1, wherein
said devices include
a first plurality of a first given number of turns at the end of said first optical fiber remote from said receiver,
a second plurality of a second given number of turns greater than said first given number of turns at one end of a second optical fiber whose other end is coupled to said first means,
said first and second plurality of turns being disposed side-by-side to provide optical coupling between said first and second optical fibers at a number of points corresponding to said first given number of turns so that progressive immersion of said first and second plurality of turns in a liquid causes a change in the coupling coefficient between said first and second optical fibers to be incrementally advanced along said coupling points, and
said first means transmits said interrogatory signal as pulses.

17. An optical fiber data transmission system comprising:
a plurality of optical signal devices;
first means coupled to said devices for transmitting an optical interrogatory signal to all of said devices;
an optical receiver;
a first optical fiber optically coupled at one end to all of said devices and at the other end to said receiver; and
second means each coupled to a different one of said devices to discriminate between optical output signals emitted from said devices in response to said interrogatory signal;
said devices including
a first plurality of a first given number of turns at the end of said first optical fiber remote from said receiver,
a second plurality of a second given number of turns greater than said first given number of turns at one end of a second optical fiber whose other end is coupled to said first means,
said first and second plurality of turns being disposed side-by-side to provide optical coupling between said first and second optical fibers at a number of points corresponding to said first given number of turns so that progressive immersion of said first and second plurality of turns in a liquid causes a change in the coupling coefficient between said first and second optical fibers to be incrementally advanced along said coupling points, and
said first means transmits said interrogatory signal as pulses.

* * * * *